United States Patent
Curatola et al.

(10) Patent No.: US 8,835,932 B2
(45) Date of Patent: *Sep. 16, 2014

(54) NORMALLY-OFF COMPOUND SEMICONDUCTOR TUNNEL TRANSISTOR WITH A PLURALITY OF CHARGE CARRIER GASES

(71) Applicant: Infineon Technologies Austria AG, Villach (AT)

(72) Inventors: Gilberto Curatola, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/051,935

(22) Filed: Oct. 11, 2013

(65) Prior Publication Data

US 2014/0034962 A1    Feb. 6, 2014

Related U.S. Application Data

(63) Continuation of application No. 13/406,568, filed on Feb. 28, 2012, now Pat. No. 8,586,993.

(51) Int. Cl.

| | |
|---|---|
| *H01L 29/778* | (2006.01) |
| *H01L 21/02* | (2006.01) |
| *H01L 29/267* | (2006.01) |
| *H01L 29/66* | (2006.01) |
| *H01L 29/40* | (2006.01) |
| *H01L 29/739* | (2006.01) |
| *H01L 29/20* | (2006.01) |

(52) U.S. Cl.
CPC ........ *H01L 29/7788* (2013.01); *H01L 29/7783* (2013.01); *H01L 21/0254* (2013.01); *H01L 29/7786* (2013.01); *H01L 29/267* (2013.01); *H01L 29/66431* (2013.01); *H01L 29/401* (2013.01); *H01L 29/7391* (2013.01); *H01L 29/2003* (2013.01)
USPC .......... 257/76; 257/77; 257/E21.09; 438/172; 438/478

(58) Field of Classification Search
USPC ............................... 257/76, 77, 194; 438/172
See application file for complete search history.

(56) References Cited

U.S. PATENT DOCUMENTS

| | | | |
|---|---|---|---|
| 7,834,345 B2 | 11/2010 | Bhuwalka et al. | |
| 8,586,993 B2 * | 11/2013 | Curatola et al. | 257/76 |
| 2013/0092958 A1 | 4/2013 | Chen et al. | |

FOREIGN PATENT DOCUMENTS

| | | |
|---|---|---|
| CA | 1265626 A1 | 2/1990 |
| DE | 3788253 T2 | 3/1994 |

OTHER PUBLICATIONS

Simon, J. et al., "Polarization-Induced Zener Tunnel Junctions in Wide-Bandgap Heterostructures." 2009 Device Research Conference, Jun. 22-24, 2009, pp. 101-102, Institute of Electrical and Electronics Engineers, University Park, PA.

(Continued)

*Primary Examiner* — Roy Potter

(74) *Attorney, Agent, or Firm* — Murphy, Bilak & Homiller, PLLC

(57) ABSTRACT

A tunnel transistor includes a first compound semiconductor, a second compound semiconductor on the first compound semiconductor, and a third compound semiconductor on the second compound semiconductor. A source extends through the second compound semiconductor into the first compound semiconductor. A drain spaced apart from the source extends through the third compound semiconductor into the second compound semiconductor. A first two-dimensional charge carrier gas extends in the first compound semiconductor from the source toward the drain and ends prior to reaching the drain. A second two-dimensional charge carrier gas extends in the second compound semiconductor from the drain toward the source and ends prior to reaching the source. A gate is over the first and second two-dimensional charge carrier gases. A corresponding method of manufacturing the tunnel transistor is also provided.

17 Claims, 8 Drawing Sheets

(56) References Cited

OTHER PUBLICATIONS

Krishnamoorthy, S., et al., "Polarization-engineered GaN/InGaN/GaN Tunnel Diodes." Applied Physics Letters, Nov. 16, 2010, pp. 1-3, vol. 97, Issue 20, American Institute of Physics.

Krishnamoorthy, S., et al., "Ill-Nitride Tunnel Diodes with Record Forward Tunnel Current Density." 2011 69th Annual Device Research Conference, Jun. 20-22, 2011, pp. 1-2, Santa Barbara, CA.

* cited by examiner

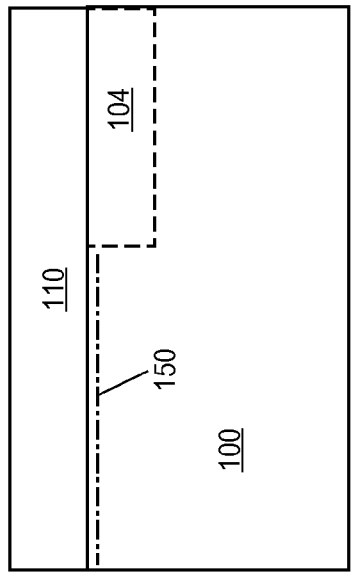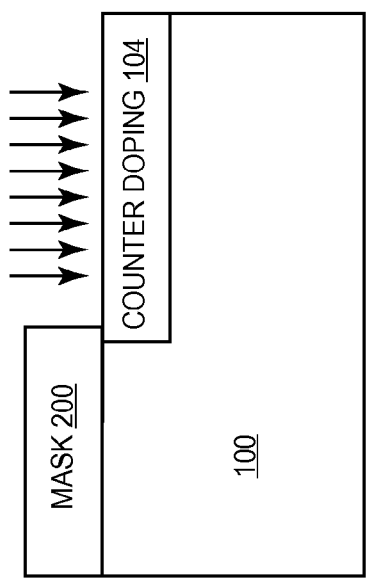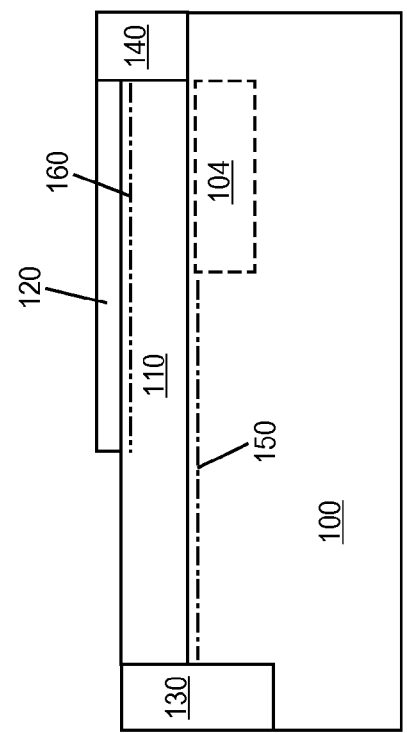

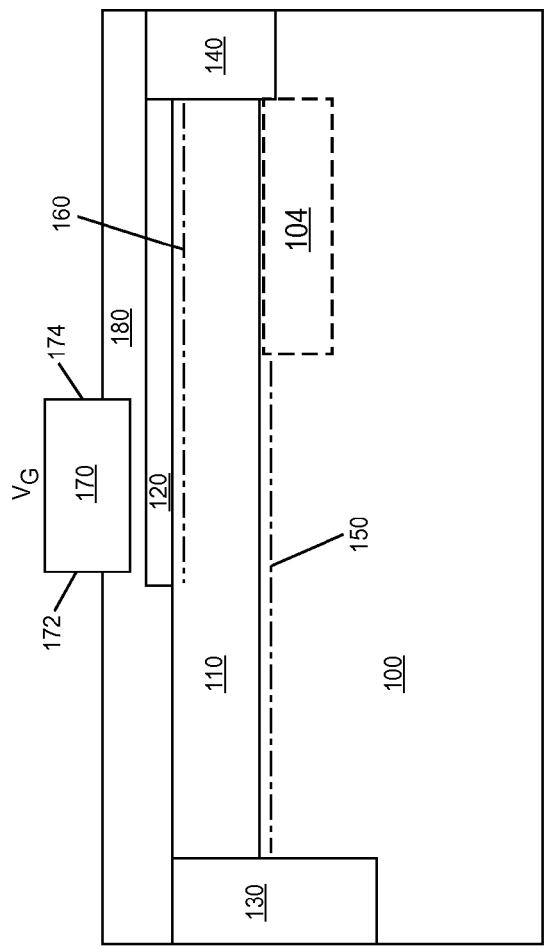
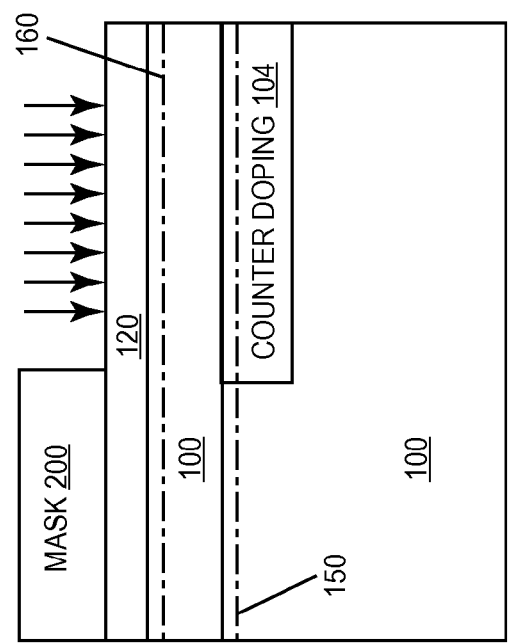
FIG. 9B
FIG. 9A

NORMALLY-OFF COMPOUND SEMICONDUCTOR TUNNEL TRANSISTOR WITH A PLURALITY OF CHARGE CARRIER GASES

PRIORITY CLAIM

This application is a Continuation of U.S. application Ser. No. 13/406,568, filed on 28 Feb. 2012, the content of said application incorporated herein by reference in its entirety.

FIELD OF TECHNOLOGY

The present application relates to tunnel transistors, in particular normally-off compound semiconductor tunnel transistors.

BACKGROUND

Conventional HEMT (high electron mobility transistor) devices fabricated in GaN technology are generally characterized by a negative threshold voltage, i.e. a current can flow between source and drain terminals even without the application of a voltage to the gate electrode. Indeed, a thin inversion layer is automatically created between the source and drain terminals due to strain and polarization effects, even without applying any voltage to the gate electrode. In this case, the device is said to be a "normally-on" transistor.

Such a feature, which is an intrinsic property of GaN technology, restricts the range of applications of GaN technology to those where a power supply is available to generate the negative voltages necessary to turn off the GaN transistor. Moreover, it complicates the design of the circuitry needed to drive GaN transistors.

Another common problem associated with field effect transistors, which can also be applied to GaN technology, are so-called short channel effects which result in increased leakage current when the source-to-drain voltage is increased, even when the transistor is in voltage blocking mode. Increased leakage current becomes more problematic as the device dimensions are scaled in order to achieve higher integration density.

Moreover, power transistors generally suffer from high sub-threshold slope which intrinsically limits the maximum speed of the transistor during switching operation. The sub-threshold slope gives an indication as to how fast a transistor can switch from the off-state to the on-state condition.

The tunnel transistor overcomes the speed limits and short channel effects described above. The main idea behind a tunnel transistor is to replace the main mechanism of carrier thermionic emission over a potential energy barrier, which controls current conduction in conventional field effect transistors, with a tunnelling process through a very thin potential barrier. In this way, short channel effects can be completely suppressed and extremely low sub-threshold slopes achieved e.g. a few mV/dec instead of hundreds mV/dec for Si-based tunnel FETs. High-volume production of tunnel transistors is mainly limited by the immaturity of the technology and the low current drive capability of tunnel transistors which significantly lags that of conventional silicon MOSFETs (metal oxide semiconductor field effect transistors).

In a typical Si-based tunnel FET, a positive voltage is applied to the gate electrode which causes an inversion layer to connect the n-type drain region with the p-type source region. In this way, a very abrupt transition between two opposite highly doped regions occurs and a very thin energy barrier is created. Electrons can tunnel (cross) this thin barrier when a potential difference is applied between the source and drain terminals. This device concept is also characterized by an ambipolar behavior. Indeed, if a negative voltage is applied to the gate electrode, a hole accumulation layer connects the source and drain regions and a tunnelling barrier is created, this time, at the interface between the hole accumulation channel and the n-type drain region.

Conventional tunnel FETs require very highly doped source/drain regions and very steep doping profiles in order for the tunnelling barrier to be very thin and for the tunnelling mechanism to occur efficiently. Moreover, in conventional tunnel FETs, the tunnelling mechanism occurs at the interface between silicon and oxide where defects strongly influence the device performance and reliability in an adverse manner.

SUMMARY

Disclosed herein are embodiments of a compound semiconductor tunnel field effect transistor which is normally-off (i.e. positive or negative voltage is needed to switch on the transistor) and has a very steep sub-threshold slope, reduced leakage, negligible short channel effects and no ampibolar behavior. The compound semiconductor tunnel field effect transistor is fast-switching and can be used for high voltage applications e.g. 30V up to 600V and higher.

According to an embodiment of a tunnel transistor, the tunnel transistor includes a first compound semiconductor, a second compound semiconductor on the first compound semiconductor and a third compound semiconductor on the second compound semiconductor. A source extends through the second compound semiconductor into the first compound semiconductor and a drain spaced apart from the source and extends through the third compound semiconductor into the second compound semiconductor. The drain has an opposite doping type as the source. A first two-dimensional charge carrier gas arises due to polarization charges and extends in the first compound semiconductor from the source toward the drain and ends prior to reaching the drain. A second two-dimensional charge carrier gas also arises due to polarization charges and extends in the second compound semiconductor from the drain toward the source and ends prior to reaching the source. A gate is over the first and second two-dimensional charge carrier gases.

According to an embodiment of a semiconductor device, the semiconductor devices includes a normally-off compound semiconductor tunnel transistor having a drive current above 100 mA per mm of gate length and a sub-threshold slope below 60 mV per decade at room temperature.

According to an embodiment of a method of manufacturing a tunnel transistor, the method includes: forming a second compound semiconductor on a first compound semiconductor and a third compound semiconductor on the second compound semiconductor so that a first two-dimensional charge carrier gas arises due to polarization charges and extends longitudinal in the first compound semiconductor and a second two-dimensional charge carrier gas arises due to polarization charges and extends longitudinal in the second compound semiconductor; forming a source extending through the second compound semiconductor into the first compound semiconductor and in contact with the first two-dimensional charge carrier gas; forming a drain extending through the third compound semiconductor into the second compound semiconductor and in contact with the second two-dimensional charge carrier gas; preventing the first two-dimensional charge carrier gas from extending to the drain; preventing the second two-dimensional charge carrier gas from extending to the source; and forming a gate over the first and second two-dimensional charge carrier gases.

According to another embodiment of a tunnel transistor, the tunnel transistor comprises a first compound semiconductor, a second compound semiconductor on the first compound semiconductor and a third compound semiconductor on the second compound semiconductor. A source extends through the second compound semiconductor into the first compound semiconductor. A drain spaced apart from the source extends through the third compound semiconductor into the second compound semiconductor. A first two-dimensional charge carrier gas extends in the first compound semiconductor from the source toward the drain and ends prior to reaching the drain. A second two-dimensional charge carrier gas extends in the second compound semiconductor from the drain toward the source and ends prior to reaching the source. A gate is over the first and second two-dimensional charge carrier gases.

According to another embodiment of a method of manufacturing a tunnel transistor, the method comprises: forming a second compound semiconductor on a first compound semiconductor and a third compound semiconductor on the second compound semiconductor so that a first two-dimensional charge carrier gas extends longitudinal in the first compound semiconductor and a second two-dimensional charge carrier gas extends longitudinal in the second compound semiconductor; forming a source extending through the second compound semiconductor into the first compound semiconductor and in contact with the first two-dimensional charge carrier gas; forming a drain extending through the third compound semiconductor into the second compound semiconductor and in contact with the second two-dimensional charge carrier gas; preventing the first two-dimensional charge carrier gas from extending to the drain; preventing the second two-dimensional charge carrier gas from extending to the source; and forming a gate over the first and second two-dimensional charge carrier gases.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 8A to 8C illustrate perspective cross-sectional views of another embodiment of a method of manufacturing a compound semiconductor tunnel transistor.

FIGS. 9A and 9B illustrate perspective cross-sectional views of yet another embodiment of a method of manufacturing a compound semiconductor tunnel transistor.

DETAILED DESCRIPTION

Described next are embodiments of a normally-off compound semiconductor tunnel field effect transistor having a relatively high drive current e.g. above 100 mA per mm of gate length and a relatively low sub-threshold slope e.g. below 60 mV per decade at room temperature, and methods of manufacturing such a normally-off compound semiconductor tunnel transistor. The compound semiconductor tunnel field effect transistor is fast-switching and can be used for high voltage applications e.g. 30V up to 600V and higher. The normally-off compound semiconductor tunnel transistor can be implemented in e.g. GaN technology. With GaN technology, the presence of polarization charges and strain effects result in the realization of a so-called "two-dimensional charge carrier gas" (also referred to herein as inversion layer) which is a two-dimensional electron or hole inversion layer characterized by very high carrier density and carrier mobility. The presence of such a two-dimensional charge carrier gas enables the use of very sharp and highly doped regions which in turn can be used to create a very thin tunnelling barrier. As described herein, a two-dimensional electron gas (2DEG) and a two-dimensional hole gas (2DHG) which occur in GaN technology due to polarization charges are used to form very thin tunnelling barriers for realizing normally-off GaN tunnel transistors. Other compound semiconductor technologies which have two-dimensional electron and hole gasses can also be used. In each case, polarization charges are used to form the two-dimensional charge carrier gases (also referred to interchangeably herein as inversion layers or channels) of the device instead of doping and implantation.

Figure 1:
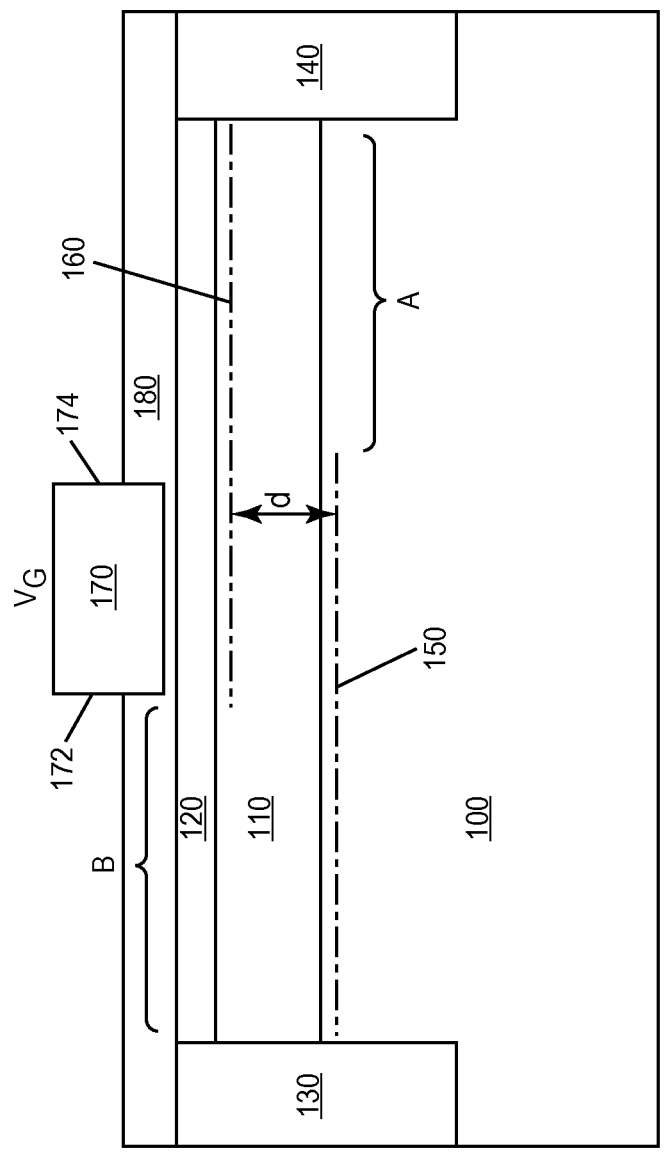
FIG. 1 illustrates a perspective cross-sectional view of an embodiment of a compound semiconductor tunnel transistor.

FIG. 1 illustrates a partial cross-sectional view of a normally-off compound semiconductor tunnel transistor. The tunnel transistor has a first (lower) compound semiconductor 100, a second (intermediary) compound semiconductor 110 on the lower compound semiconductor 100 and a third (upper) compound semiconductor 120 on the intermediary compound semiconductor 110. A first doped region 130 extends through the intermediary compound semiconductor 120 (and also possibly through the upper compound semiconductor 120 as shown in FIG. 1) into the lower compound semiconductor 100. A second doped region 140 laterally spaced apart from the first doped region 130, extends through the upper compound semiconductor 120 into the intermediary compound semiconductor 120 (and also possibly into the lower compound semiconductor 100 as shown in FIG. 1). The second doped region 140 has the opposite doping type as the first doped region 130. The doped regions 130, 140 form the source and drain of the tunnel transistor.

The compound semiconductors 100, 110, 120 are selected such that the respective bandgaps of the compound semiconductors 100, 110, 120 cause polarization charges which yield a first (lower) two-dimensional charge carrier gas 150 extending longitudinal in the lower compound semiconductor 100 and a second (upper) two-dimensional charge carrier gas 160 extending longitudinal in the intermediary compound semiconductor 110. The two-dimensional charge carrier gasses 150, 160 provide inversion layers of the opposite charge carrier types. In one embodiment, the intermediary compound semiconductor 110 has a larger bandgap than the lower and upper compound semiconductors 100, 120. In another embodiment, the intermediary compound semiconductor 110 has a lower bandgap than the lower and upper compound semiconductors 100, 120. In both cases, doping and implantation are not needed to create the inversion layers (channels) 150, 160 and quantum wells are not needed to confine the carriers within the compound semiconductors 100, 110, 120. For example when a GaN-based system is employed as described later in more detail, the resulting polarization charges can be used to form the inversion layers (channels) 150, 160 instead of doping and implantation.

In one embodiment, the lower two-dimensional charge carrier gas 150 is a 2DHG and the upper two-dimensional charge carrier gas 160 is a 2DEG so that the tunnel transistor is an nMOS (n-type) device. Alternatively, the lower two-dimensional charge carrier gas 150 can be a 2DEG and the upper two-dimensional charge carrier gas 160 can be a 2DHG so that the tunnel transistor is a pMOS (p-type) device. In either case, the lower two-dimensional charge carrier gas 150 arises due to polarization charges and extends in the lower compound semiconductor 100 from the first doped region 130 toward the second doped region 140 and ends prior to reaching the second doped region 140. Similarly, the upper two-dimensional charge carrier gas 160 also arises due to polarization charges and extends in the intermediary compound semiconductor 110 from the second doped region 140 toward the first doped region 130 and ends prior to reaching the first doped region 130. The first doped region 130 is doped p-type when the lower two-dimensional charge carrier gas 150 is a 2DHG and doped n-type when the lower two-dimensional charge carrier gas 150 is a 2DEG. Likewise, the second doped region 140 is doped n-type when the upper two-dimensional charge carrier gas 160 is a 2DEG and doped p-type when the upper two-dimensional charge carrier gas 160 is a 2DHG. A gate 170 is formed over the upper and lower two-dimensional charge carrier gases 150, 160, and is insulated from the upper compound semiconductor 120 by a dielectric material 180.

The gate 170 has a first side 172 facing the first doped region 130 and a second side 174 facing the second doped region 140. In one embodiment, the lower two-dimensional charge carrier gas 150 extends longitudinal in the lower compound semiconductor 100 past the second side 174 of the gate 170 and ends prior to reaching the second doped region 140 as indicated by the section of the lower compound semiconductor 100 labeled 'A' in FIG. 1. In one embodiment, the removal of the lower two-dimensional charge carrier gas 150 from a region of the lower compound semiconductor 100 can be done only for a small portion close to the second doped region 140. Doing so creates a type of compensated structure where the distribution of the electric field is more uniformly distributed along the drift region of a GaN field effect transistor. This results in an increase of the leakage current that can flow directly from the upper channel 160 down to the lower channel 150. As a consequence, the overlap of the two channels 150, 160 can be optimized, i.e. a trade-off exists between the uniformity of the electric field and the leakage current. Alternatively, the electric field can be re-shaped via additional metal field plates on top of the gate electrode 170. In either case, the upper two-dimensional charge carrier gas 160 extends longitudinal in the intermediary compound semiconductor 110 past the first side 172 of the gate 170 and ends prior to reaching the first doped region 130 as indicated by the section of the intermediary compound semiconductor 110 labeled 'B' in FIG. 1.

The gate 170 adjusts the carrier concentration of the upper two-dimensional charge carrier gas 150 in order to cause tunneling across the tunneling barrier between the two-dimensional charge carrier gases 150, 160, responsive to a voltage ($V_G$) applied to the gate 170. The carrier concentration of the upper two-dimensional charge carrier gas 150 is less than that of the lower two-dimensional charge carrier gas 160 so that tunneling is suppressed under the gate 170 absent a voltage applied to the gate 170, resulting in the tunnel transistor being off i.e. no continuous current channel is formed between the doped regions 130, 140 and hence the use of the term 'normally-off' to describe the transistor.

In one embodiment, the initial carrier concentration of the lower and upper two-dimensional charge carrier gases 150, 160 is fixed based on the aluminum content and thickness of the compound semiconductors 100, 110, 120 so that tunneling is suppressed under the gate 170 absent a sufficient fate voltage ($V_G$). The gate 170 adjusts the carrier concentration of the upper two-dimensional charge carrier gas 160 responsive to a voltage applied to the gate 170, so that tunneling can occur between the two-dimensional charge carrier gases 150, 160 over a length of the gate 170. A positive voltage is applied to cause tunneling when the upper two-dimensional charge carrier gas 160 is a 2DEG and the lower two-dimensional charge carrier gas 150 is a 2DHG, and a negative voltage is applied to cause tunneling when the upper two-dimensional charge carrier gas 160 is a 2DHG and the lower two-dimensional charge carrier gas 150 is a 2DEG.

The upper and lower two-dimensional charge carrier gases 150, 160 are separated by a relatively small distance d e.g. 10 nm or less, e.g. 5 nm or less. Such close spacing forms a tunneling barrier through which carriers can tunnel responsive to a voltage difference applied between the first and second doped regions 130, 140 i.e. between the source and drain regions of the tunnel transistor. The concentration of the two-dimensional charge carrier gases 150, 160 can be tuned by the material stack used as described above. In particular, by changing, for example, the thickness and Al content of different AlGaN layers in the stack, the concentration of the two inversion layers 150, 160 can be controlled. By this mechanism, the concentration of the upper two-dimensional charge carrier gas 160 can be tuned (adjusted) so that the tunneling mechanisms are suppressed when there is no voltage applied to the gate 170. When a voltage is applied to the gate 170, the concentration of the upper two-dimensional charge carrier gas 150 enhances in the region under the gate 170 until a certain concentration is reached which allows the tunneling mechanisms to occur between the upper and lower two-dimensional charge carrier gases 150, 160. In this way, a normally-off operation is provided while also making use of a tunneling operation that yields a very steep sub-threshold slope, reduced leakage, negligible short channel effects and no ampibolar behavior. The compound semiconductor tunnel field effect transistor is fast-switching and can be used for high voltage applications e.g. 30V up to 600V and higher.

Figure 2:
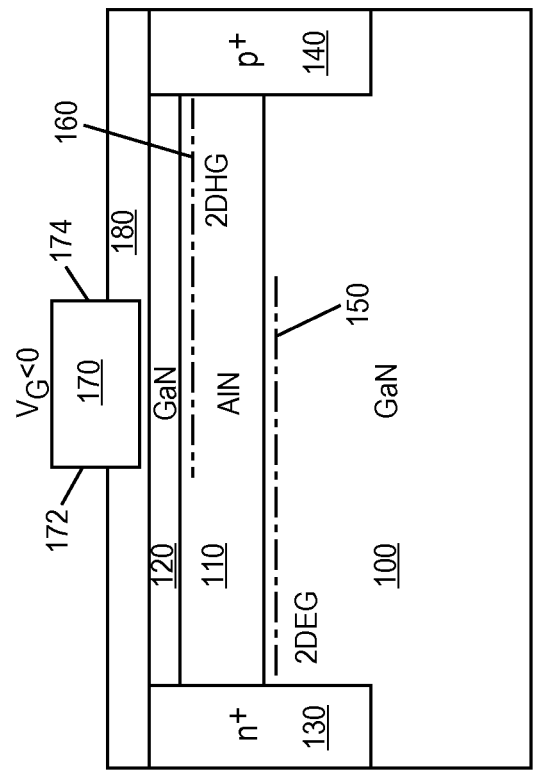
FIG. 2 illustrates a perspective cross-sectional view of an embodiment of an n-type compound semiconductor tunnel transistor.

FIG. 2 illustrates a partial cross-sectional view of the normally-off compound semiconductor tunnel transistor of FIG. 1, implemented as an n-channel (n-type) device using a GaN-based system. With GaN-based systems, polarization charges are utilized to form the two-dimensional charge carrier gases 150, 160 instead of doping and implantation. In more detail, the lower compound semiconductor 100 comprises GaN, the intermediary compound semiconductor 110 comprises InGaN and the upper compound semiconductor comprises 120 GaN according to this embodiment. The intermediary InGaN layer 110 has a lower bandgap than the upper and lower GaN layers 100, 120. The first doped region 130 is doped p-type (p+) and forms the source of the tunnel transistor. The second doped region 140 is doped n-type (n+) and forms the drain of the tunnel transistor. The upper GaN layer 120 is in contact with the intermediary InGaN layer 110, causing a 2DEG 160 to arise in the InGaN layer 110 near the interface with the upper GaN layer 120. The intermediary InGaN layer 110 is in contact with the lower GaN layer 100, causing a 2DHG 150 to arise in the lower GaN layer 100 near the interface with the intermediary InGaN layer 110. According to this embodiment of the tunnel transistor, the transistor is switched on when a positive voltage ($V_G$) is applied to the gate 170.

Figure 3:
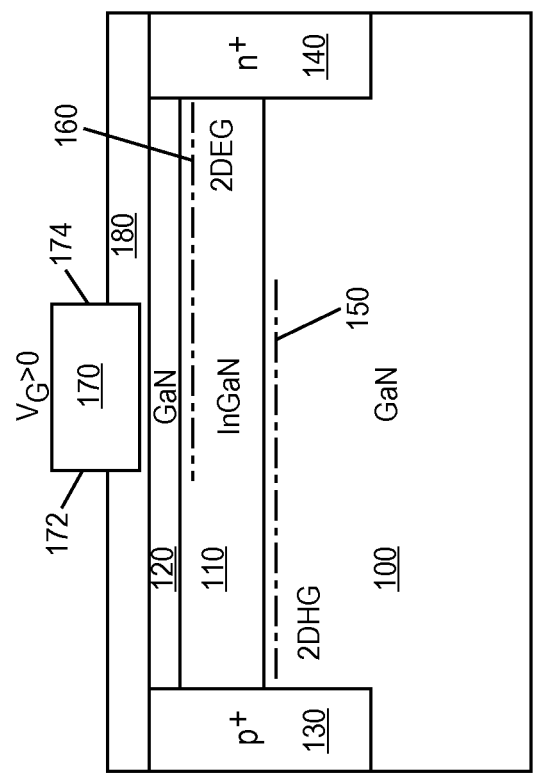
FIG. 3 illustrates a perspective cross-sectional view of an embodiment of a p-type compound semiconductor tunnel transistor.

FIG. 3 illustrates a partial cross-sectional view of the normally-off compound semiconductor tunnel transistor of FIG. 1, implemented as a p-channel type device using a GaN-based system. According to this embodiment, the lower compound semiconductor 100 comprises GaN, the intermediary compound semiconductor 110 comprises AlN and the upper compound semiconductor 120 comprises GaN. The intermediary AlN layer 110 has a larger bandgap than the upper and lower GaN layers 100, 120. The two-dimensional charge carrier gases 150, 160 arise due to polarization charges, instead of doping and implantation. The first doped region 130 is doped n-type (n+) and forms the drain of the tunnel transistor. The second doped region 140 is doped p-type (p+) and forms the source of the tunnel transistor. The upper GaN layer 120 is in contact with the intermediary AlN layer 110, causing a 2DHG 160 to arise in the AlN layer 110 near the interface with the upper GaN layer 120. The intermediary AlN layer 110 is in contact with the lower GaN layer 100, causing a 2DEG 150 to arise in the lower GaN layer 100 near the interface with the intermediary AlN layer 110. According to this embodiment of the tunnel transistor, the transistor is switched on when a negative voltage ($V_G$) is applied to the gate 170.

Figure 5:
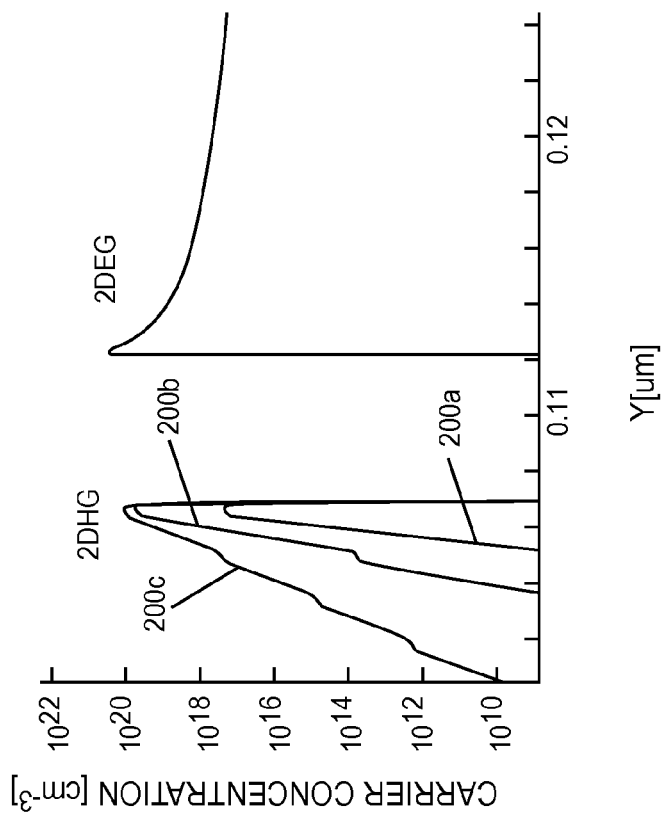
FIG. 5 is a plot diagram of channel carrier concentrations as a function of voltage applied to the gate of a compound semiconductor tunnel transistor.
Figure 4:
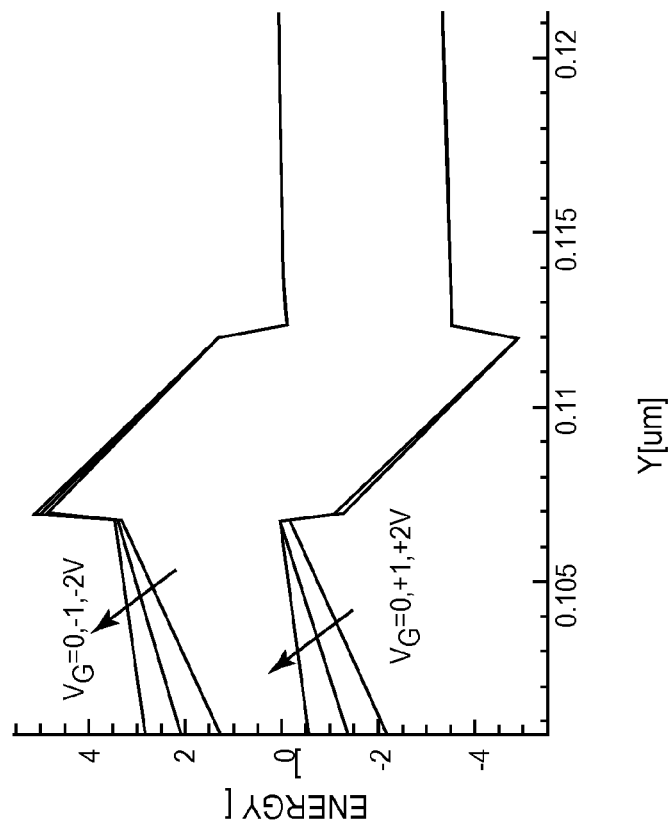
FIG. 4 is a plot diagram of the conduction band profile for a two-dimensional electron gas and a two-dimensional hole gas in GaN technology.

FIGS. 4 and 5 illustrate the operational principle of the tunnel GaN transistor shown in FIG. 3. Particularly, FIG. 4 illustrates the energy barriers for both a 2DHG and a 2DEG as a function of distance from the gate. The upper curve labeled '2DHG' pertains to the example explained below, with reference to the p-type tunnel transistor of FIG. 3. The lower curve labeled '2DEG' pertains to the n-type tunnel transistor of FIG. 2. FIG. 5 illustrates the electron and hole concentrations for the tunnel transistor of FIG. 3 for different gate voltages. The initial hole concentration of the upper 2DHG 160, represented by the curve labeled 200a, can be fixed in such a way that the hole concentration is much lower than electron concentration of the lower 2DEG 150 for zero voltage applied to the gate 170. As a consequence, tunneling mechanisms are suppressed for $V_G$=0V and the GaN transistor is in the off-state. When a negative voltage is applied to the gate 170, the hole concentration of the upper 2DHG 160 is enhanced and the electron concentration of the lower 2DEG 150 remains generally constant because the upper 2DHG 160 is closer to the gate 170 than the lower 2DEG 150 and thus affected much more substantially by the gate voltage. After a certain voltage level is reached, the hole concentration of the upper 2DHG 160 reaches a level that causes tunneling events to occur below the gate 170 with the lower 2DEG 150 as represented by the curve labeled 200b in FIG. 5. This voltage level represents the effective transistor threshold voltage of the tunnel transistor. More negative gate voltages have little effect on the tunneling mechanism, while increasing the hole carrier concentration closer to the gate 170 as represented by the curve labeled 200c in FIG. 5. Similar operation occurs for an n-type compound semiconductor tunnel transistor, except the upper inversion channel 160 is a 2DEG, the lower inversion channel 150 is a 2DHG and a positive gate voltage is needed to cause tunneling under the gate 170.

Figure 6:
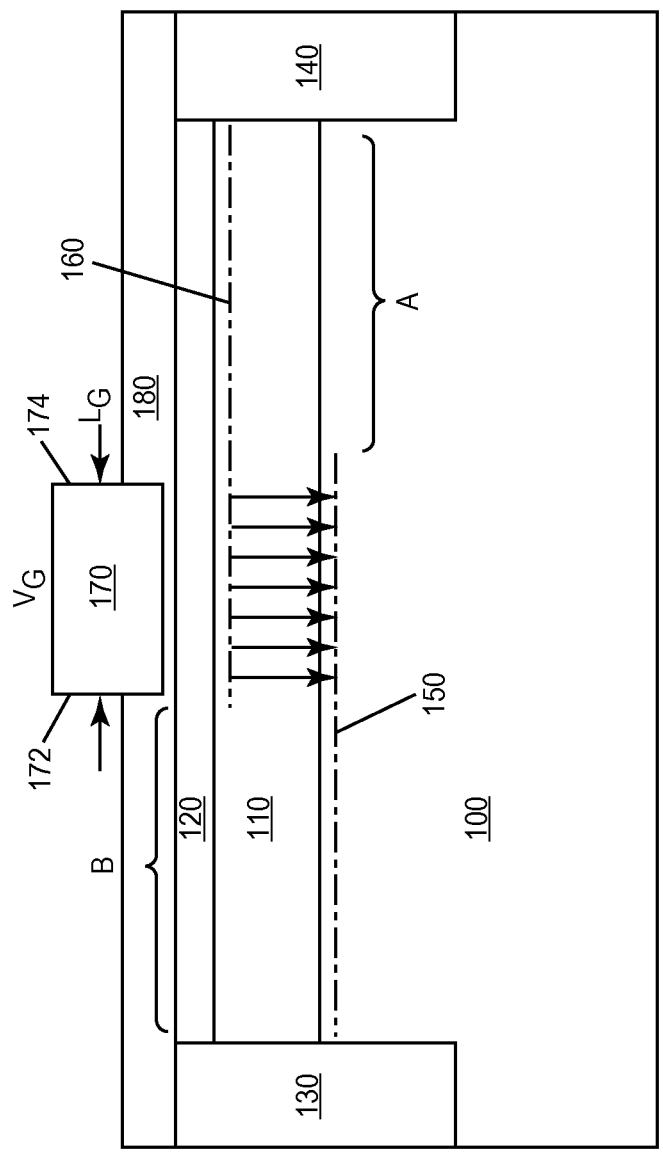
FIG. 6 illustrates a perspective cross-sectional view of an embodiment of a compound semiconductor tunnel transistor.

FIG. 6 illustrates a partial cross-sectional view of the normally-off compound semiconductor tunnel transistor of FIG. 2, when the tunneling mechanisms are active. The tunneling mechanisms are indicated by downward facing arrows which represent charge carriers crossing the potential barrier between the upper and lower two-dimensional gases 150, 160. Contrary to conventional tunnel transistors where tunneling occurs in a very limited spatial region of the device very close to the silicon/oxide interface, the compound semiconductor tunnel transistors described herein provide tunneling which occurs away from the semiconductor/dielectric interface and thus is less influenced by surface states and defects. Also, the tunneling mechanism occurs over the entire length ($L_G$) of the gate 170 for the tunnel transistors described herein. Multiple tunneling paths act as a boosting mechanism for the current. Consequently, very high current drive capability can be obtained. In one embodiment, the tunnel transistor has a drive current above 100 mA per mm of gate length and a sub-threshold slope below 60 mV per decade at room temperature.

As shown in FIGS. 1-3 and 6, the lower two-dimensional charge carrier gas 150 is prevented from reaching the second doped region 140 over the section of the lower compound semiconductor 100 labeled 'A', and the upper two-dimensional charge carrier gas 160 is similarly prevented from reaching the first doped region 130 over the section of the intermediary compound semiconductor 110 labeled 'B'. Described next are several embodiments of methods of preventing the two-dimensional charge carrier gases 150, 160 from each extending contiguously in contact with both doped regions 130, 140 (source and drain) of the device.

Figure 7:
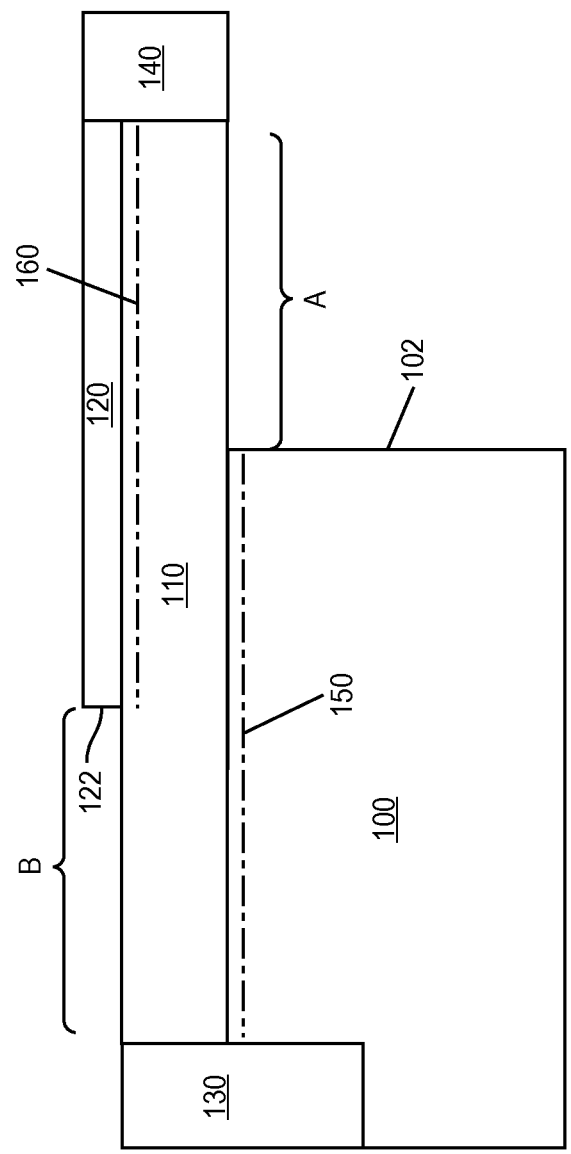
FIG. 7 illustrates a perspective cross-sectional view of an embodiment of a method of manufacturing a compound semiconductor tunnel transistor.

FIG. 7 illustrates an embodiment of manufacturing a compound semiconductor tunnel transistor with the gate structure not shown for ease of illustration. According to this embodiment, the lower two-dimensional charge carrier gas 150 is prevented from extending to the second doped region 140 by removing region 'A' of the lower compound semiconductor 100. This way, the lower compound semiconductor 100 has a lateral edge 102 spaced apart from second doped region 140 and the lower two-dimensional charge carrier gas 150 extends longitudinal in the lower compound semiconductor 100 from the first doped region 130 to the edge 102 of the lower compound semiconductor 100. Section 'A' of the lower compound semiconductor 100 can be removed by any suitable mask and etch processes.

The upper two-dimensional charge carrier gas 160 is similarly prevented from extending to the first doped region 130 by removing region 'B' of the upper compound semiconductor 100. This way, the upper compound semiconductor 120 has a lateral edge 122 spaced apart from first doped region 130 and the upper two-dimensional charge carrier gas 160 extends longitudinal in the intermediary compound semiconductor 110 from the second doped region 140 to the edge 122 of the upper compound semiconductor 120. Section 'B' of the upper compound semiconductor 120 can be removed by any suitable mask and etch processes.

FIGS. 8A to 8C illustrate another embodiment of manufacturing a compound semiconductor tunnel transistor, again with the gate structure not shown for ease of illustration. According to this embodiment, the lower two-dimensional charge carrier gas 150 is prevented from extending to the second doped region 140 by forming a mask 200 on a protected portion of the lower compound semiconductor 100 and doping the exposed part of the lower compound semiconductor 100 to create a counter doped region 104 in the lower compound semiconductor 100 as shown in FIG. 8A. For example, during the epitaxial stack formation and prior to barrier formation (i.e. formation of the intermediary compound semiconductor 110), a counter doping implantation can be performed in the unmasked part of the lower compound semiconductor 100. The dopant species prevents the lower two-dimensional charge carrier gas 150 from arising in the lower compound semiconductor 100 in the counter doped region 104. This way, the formation of an inversion channel in the implanted region 104 of the lower compound semiconductor 100 does not occur when the intermediary compound semiconductor 110 is subsequently formed on the lower compound semiconductor 100 as indicated by the dashed box in FIG. 8B. The upper compound semiconductor 120 can then be formed on the intermediary compound semiconductor 110, the doped regions 130, 140 (source and drain) formed and the upper compound semiconductor 120 etched in a region between the gate 170 and the first doped region 130 (e.g. region 'B' in FIGS. 1, 6 and 7) as shown in FIG. 8C and explained above with reference to FIG. 7. This prevents the upper two-dimensional charge carrier gas 160 from extending longitudinal in the intermediary compound semiconductor 110 from the second doped region 140 all the way to the first doped region 130.

FIGS. 9A and 9B illustrate yet another embodiment of manufacturing a compound semiconductor tunnel transistor which is similar to the embodiment shown in FIGS. 8A to 8C, however the mask 200 and doping processes for preventing the lower two-dimensional charge carrier gas 150 from extending to the second doped region 140 are performed after formation of the lower, intermediary and upper compound semiconductors 100, 110, 120 as indicated by the downward facing arrows in FIG. 9A. For example, a counter doping implantation can be performed after final device fabrication from the top side (by properly choosing implantation dose and energy) to eliminate the lower two-dimensional charge carrier gas 150 in the unmasked region of the lower compound semiconductor 100. The dose and energy of the implanted species is selected so as not to influence the upper two-dimensional charge carrier gas 160. FIG. 9B shows the tunnel transistor device after formation of the doped regions 130, 140 (source and drain) and the gate 170.

Figure 10:
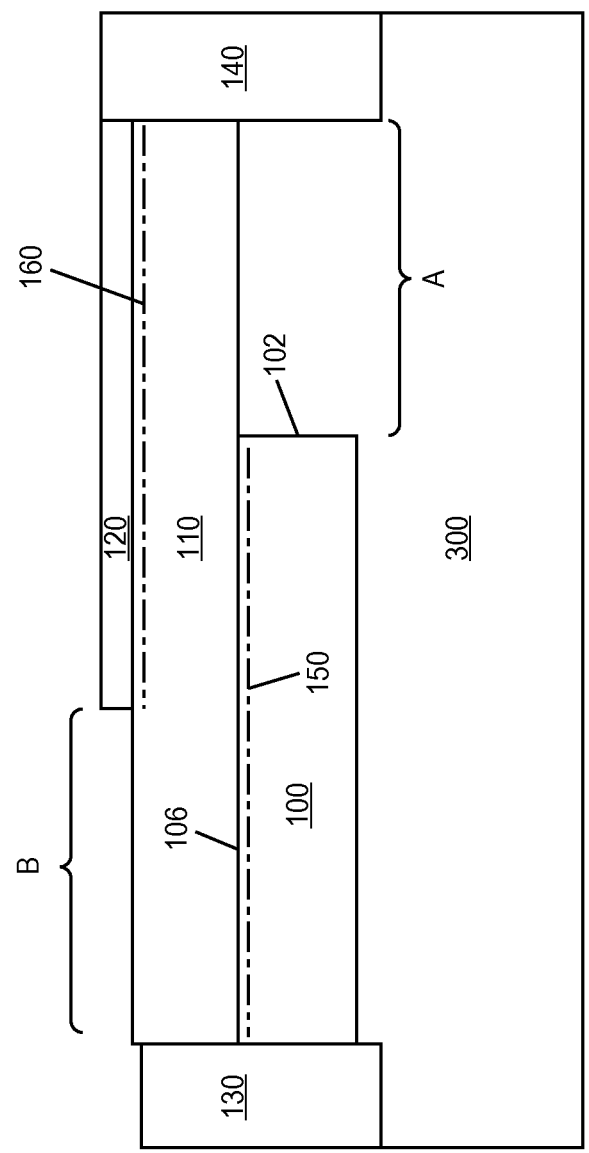
FIG. 10 illustrates a perspective cross-sectional view of still another embodiment of a method of manufacturing a compound semiconductor tunnel transistor.

FIG. 10 illustrates another embodiment of manufacturing a compound semiconductor tunnel transistor with the gate structure not shown for ease of illustration. According to this embodiment, the lower compound semiconductor 100 is formed on a substrate 300 made of the same material as the intermediary compound semiconductor 110. Region 'A' of the lower compound semiconductor 100 is removed e.g. as explained above with reference to FIG. 7. The intermediary compound semiconductor 110 is then formed along the top side 106 and the edge 102 of the lower compound semiconductor 100 as shown in FIG. 10. The upper compound semiconductor 120 can then be formed on the intermediary compound semiconductor 110, the doped regions 130, 140 (source and drain) formed and the upper compound semiconductor 120 removed in region 'B' as explained above with reference to FIG. 7. This way, neither of the two-dimensional charge carrier gases 150, 160 extends contiguously in contact with both doped regions 130, 140 (source and drain) of the tunnel transistor device.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A tunnel transistor, comprising:
a first compound semiconductor;
a second compound semiconductor on the first compound semiconductor;
a third compound semiconductor on the second compound semiconductor;
a source extending through the second compound semiconductor into the first compound semiconductor;
a drain spaced apart from the source and extending through the third compound semiconductor into the second compound semiconductor;
a first two-dimensional charge carrier gas extending in the first compound semiconductor from the source toward the drain and ending prior to reaching the drain;
a second two-dimensional charge carrier gas extending in the second compound semiconductor from the drain toward the source and ending prior to reaching the source; and
a gate over the first and second two-dimensional charge carrier gases.

2. A tunnel transistor according to claim 1, wherein an initial carrier concentration of the first and second two-dimensional charge carrier gases is fixed based on an aluminum content and thickness of the compound semiconductors so that tunneling is suppressed between the first and second two-dimensional charge carrier gases absent a voltage applied to the gate.

3. A tunnel transistor according to claim 2, wherein the gate is configured to adjust the carrier concentration of the second two-dimensional charge carrier gas so that tunneling occurs between the first and second two-dimensional charge carrier gases over a length of the gate responsive to a voltage applied to the gate.

4. A tunnel transistor according to claim 1, wherein the first two-dimensional charge carrier gas is a two-dimensional hole gas and the second two-dimensional charge carrier gas is a two-dimensional electron gas.

5. A tunnel transistor according to claim 1, wherein the first two-dimensional charge carrier gas is a two-dimensional electron gas and the second two-dimensional charge carrier gas is a two-dimensional hole gas.

6. A tunnel transistor according to claim 1, wherein the second compound semiconductor has a lower bandgap than the first and third compound semiconductors.

7. A tunnel transistor according to claim 6, wherein the first compound semiconductor comprises GaN, the second compound semiconductor comprises InGaN and the third compound semiconductor comprises GaN.

8. A tunnel transistor according to claim 1, wherein the second compound semiconductor has a larger bandgap than the first and third compound semiconductors.

9. A tunnel transistor according to claim 8, wherein the first compound semiconductor comprises GaN, the second compound semiconductor comprises AlN and the third compound semiconductor comprises GaN.

10. A tunnel transistor according to claim 1, wherein the first and second two-dimensional charge carrier gases are spaced 10 nm or less apart under the gate.

11. A tunnel transistor according to claim 1, wherein the gate has a first side facing the source and a second side facing the drain, the first two-dimensional charge carrier gas extends in the first compound semiconductor past the second side of the gate and ends prior to reaching the drain, and the second two-dimensional charge carrier gas extends in the second compound semiconductor past the first side of the gate and ends prior to reaching the source.

12. A method of manufacturing a tunnel transistor, comprising:
forming a second compound semiconductor on a first compound semiconductor and a third compound semiconductor on the second compound semiconductor so that a first two-dimensional charge carrier gas extends longitudinal in the first compound semiconductor and a second two-dimensional charge carrier gas extends longitudinal in the second compound semiconductor;
forming a source extending through the second compound semiconductor into the first compound semiconductor and in contact with the first two-dimensional charge carrier gas;
forming a drain extending through the third compound semiconductor into the second compound semiconductor and in contact with the second two-dimensional charge carrier gas;
preventing the first two-dimensional charge carrier gas from extending to the drain;
preventing the second two-dimensional charge carrier gas from extending to the source; and
forming a gate over the first and second two-dimensional charge carrier gases.

13. A method according to claim 12, further comprising fixing an initial carrier concentration of the first and second two-dimensional charge carrier gases based on an aluminum content and thickness of the compound semiconductors so that tunneling is suppressed between the first and second two-dimensional charge carrier gases absent a voltage applied to the gate.

14. A method according to claim 12, wherein preventing the first two-dimensional charge carrier gas from extending to the drain comprises removing the first compound semiconductor in a region between the gate and the drain so that the first compound semiconductor has a lateral edge spaced apart from drain and the first two-dimensional charge carrier gas extends longitudinal in the first compound semiconductor from the source to the edge of the first compound semiconductor.

15. A method according to claim 14, wherein forming the second compound semiconductor on the first compound semiconductor comprises forming the second compound semiconductor along a top side and the edge of the first compound semiconductor.

16. A method according to claim 12, wherein preventing the first two-dimensional charge carrier gas from extending to the drain comprises doping the first compound semiconductor in a region between the gate and the drain with a dopant species that prevents the first two-dimensional charge carrier gas from arising in the first compound semiconductor between the gate and the drain.

17. A method according to claim 12, wherein preventing the second two-dimensional charge carrier gas from extending to the source comprises removing the third compound semiconductor in a region between the gate and the source so that the third compound semiconductor has a lateral edge spaced apart from source and the second two-dimensional charge carrier gas extends longitudinal in the second compound semiconductor from the drain to the edge of the third compound semiconductor.

* * * * *